United States Patent
Sanduleanu et al.

(10) Patent No.: US 8,736,395 B2
(45) Date of Patent: *May 27, 2014

(54) POLAR MODULATION APPARATUS AND METHOD WITH COMMON-MODE CONTROL

(75) Inventors: Mihai A. T Sanduleanu, Maastricht (NL); Ram P. Aditham, Eindhoven (NL); Eduard F. Stikvoort, Eindhoven (NL)

(73) Assignee: NXP, B.V., Eindhoven (NL)

( * ) Notice: Subject to any disclaimer, the term of this patent is extended or adjusted under 35 U.S.C. 154(b) by 116 days.

This patent is subject to a terminal disclaimer.

(21) Appl. No.: 13/332,932

(22) Filed: Dec. 21, 2011

(65) Prior Publication Data

US 2012/0119840 A1 May 17, 2012

Related U.S. Application Data

(63) Continuation of application No. 12/093,704, filed as application No. PCT/IB2006/054040 on Nov. 1, 2006, now Pat. No. 8,106,720.

(30) Foreign Application Priority Data

Nov. 18, 2005 (EP) .................................. 05110928

(51) Int. Cl.
*H03C 3/38* (2006.01)
*H03C 1/50* (2006.01)
*H04B 1/02* (2006.01)

(52) U.S. Cl.
USPC ........................... 332/145; 332/151; 455/102

(58) Field of Classification Search
USPC .......... 332/103, 105, 145, 151, 152; 375/261, 375/279, 298, 308, 329; 455/102
See application file for complete search history.

(56) References Cited

U.S. PATENT DOCUMENTS

| | | | |
|---|---|---|---|
| 6,137,354 A | 10/2000 | Dacus et al. | |
| 6,141,541 A | 10/2000 | Midya et al. | |
| 6,194,963 B1 | 2/2001 | Camp, Jr. et al. | |
| 7,072,626 B2 | 7/2006 | Hadjichristos | |
| 7,366,482 B2 | 4/2008 | Hara et al. | |
| 7,383,027 B2 | 6/2008 | Matsuura et al. | |
| 7,428,407 B2 | 9/2008 | Kraut et al. | |
| 7,555,057 B2 | 6/2009 | Staszewski et al. | |
| 8,106,720 B2 * | 1/2012 | Sanduleanu et al. | 332/145 |
| 2002/0024142 A1 | 2/2002 | Sekiguchi | |
| 2004/0092236 A1 | 5/2004 | Irie et al. | |
| 2004/0219891 A1 | 11/2004 | Hadjichristos | |
| 2004/0232988 A1 | 11/2004 | Nakatani et al. | |
| 2005/0271161 A1 | 12/2005 | Staszewki et al. | |

FOREIGN PATENT DOCUMENTS

| | | |
|---|---|---|
| CN | 1649254 A | 8/2005 |
| JP | 2005295533 A | 10/2005 |

* cited by examiner

*Primary Examiner* — Levi Gannon

(57) ABSTRACT

The present invention relates to a polar modulation apparatus and method, in which a polar-modulated signal is generated based on separately processed phase modulation (PM) and amplitude modulation (AM) components of an input signal. An amplified polar modulated output signal is generated in accordance with the phase modulation and amplitude modulation components by using a differential power amplifier circuitry(30) and supplying an amplified phase modulation component to a differential input of the differential power amplifier circuitry(30). A bias input of the differential power amplifier circuitry(30) is controlled based on the amplitude modulation component, so as to modulate a common-mode current of the differential power amplifier circuitry(30). Thereby, a new concept of a polar modulator with static DC-DC converter and power and/or efficiency and/or linearity controlled output power amplifier can be achieved.

19 Claims, 6 Drawing Sheets

POLAR MODULATION APPARATUS AND METHOD WITH COMMON-MODE CONTROL

RELATED PATENT DOCUMENTS

This patent document is a continuation under 35 U.S.C. §120 of U.S. patent application Ser. No. 12/093,704 filed on Feb. 10, 2009, now U.S. Pat. No. 8,106,720 which is a 35 U.S.C. §371 national stage entry of International Application No. PCT/IB2006/054040 filed on Nov. 1, 2006, which claims priority benefit under 35 U.S.C. §119 of European Patent Application No. 05110928.8 filed on Nov. 18, 2005, to which priority is also claimed here.

The present invention relates to a polar modulation apparatus, wherein phase modulation and amplitude modulation components of an input signal are processed in separated paths.

In current power amplifier (PA) designs, linearity and power efficiency are important requirements. There are several parameters affecting the linearity and efficiency requirements, such as compression point, output power, available gain or accuracy, which can be expressed by an error vector magnitude (EVM). It is almost impossible to optimize all the design parameters in the same time. For instance, efficiency and linearity requirements are two contradictory requirements. In principle, increased linearity for high power levels results in less power efficiency and, on the other hand, increased efficiency for low power levels results in poor linearity.

The above problem becomes even more demanding for wireless communication systems having amplitude and phase modulation, e.g., quadrature amplitude modulation (QAM). Especially for wireless communication systems using orthogonal frequency division multiplex (OFDM) as modulation scheme, the above problem gets even worse due to the fact that OFDM signals possess high peak to average ratios (e.g. 10 dB) which determines another design parameter of the PA design. Such high peak to average ratios require class A and AB driving schemes for the PAs for said OFDM communication systems. However, using class A and AB leads to a significant reduction of efficiency of the PAs. For example, Wireless Local Area Network (WLAN) PAs need to provide power levels in the order of 19 to 21 dBm at the output and have to meet EVM requirements with a power aided efficiency (PAE) of 20 percent or higher.

Polar modulation technology has been developed to facilitate system design for solving the above efficiency requirements. A polar modulator can independently process a carrier's amplitude and phase signals, typically working together with a non-linear power amplifier operating in switched mode. The elimination of the linear operation requirement enables power amplifier efficiency to be maximized for each modulation standard. Under a polar modulation scheme, multimode operation may be achieved by digital switching.

FIG. 2 shows an example of a conventional polar modulator with envelope tracking via an amplitude agile DC-DC converter 60. A baseband digital processor 80 provides I and Q signals that are up-converted with an IQ mixer 106, 108 to the RF frequency, using a phase locked loop (PLL) circuit 102 and an IQ phase shifting circuit 104. The up-converted signals are combined at a summing circuit 110, and the combined phase modulated signal is then supplied via a bandpass filter 40 to a phase modulation driver 50 which applies it to a differential output stage with input transistors Q1 and Q2, cascode transistors Q3 and Q4, load inductors L and a stray inductance $L_s$. On the other hand, the envelope modulated signal EM is generated from a digital-to-analog (D/A) converter and applied to the DC-DC converter 60 that provides the envelope modulated signal and a biasing signal to a supply terminal of the output stage. At the output stage, the envelope modulated signal is combined with the phase modulated signal to generate an amplified polar modulated signal which is supplied to a transmission antenna via a matching circuit 70 for impedance matching. A bias input is provided at a common bias control terminal connected to the base electrodes of the cascode transistors Q3 and Q4. However, the bandwidth of the phase and amplitude signals is about 3-5 times the bandwidth of the original signal. Problems of this approach are the tracking bandwidth of the DC-DC converter 60, which cannot track fast amplitude modulated signals, and the cost of such a device. In the classical approach, the phase modulation driver 50 is a discrete solution driver with resonant loads for efficiency improvement. Integrated solutions are still possible but the price paid is the area of the resonant loads realized with integrated inductors and capacitors. Another problem that should be solved is the power control and the class control that provides a solution tailored to different input power levels and efficiency requirements.

US2004/0219891A1 discloses a polar modulation transmitter circuit with reduced adjacent channel power ratio (ACPR) in its output signal by controlling the relative delay between its envelope and phase modulation operations based on direct and indirect feedback measurement of the output signal's ACPR. An extended transmit power control range is provided by using a staged amplifier circuit which includes a driver amplifier operating in combination with a power amplifier circuit to impart desired envelope modulation. Scaled envelope modulation signals are generated from input envelope modulation information signal by providing a modulated supply signal to the power amplifier circuit.

Other concepts use the CORDIC algorithm for generating the amplitude/phase components and combining the two signals at radio frequency (RF), i.e. in the last stage. To achieve this, output transistors have been binary weighted in emitter areas and switched on or off with a digital code representing the amplitude modulation. This concept allows 80 dB dynamic range power control via attenuation and bias control. The internal PA is a broadband PA with wideband amplitude modulation. This solution results in a programmable and configurable solution with the ability to correct for distortion in a digital manner. The output stage operates in class-E, which is enabled by the operation of an output filter and matching circuit. A reactance compensation technique allows broadband matching and the required class E of operation. However, disadvantages of this approach are summarized below.

The measured efficiency of the PA is 38% despite of the class E operation. Moreover, chokes or large resistors are required for providing a correct matching at the input of the PA, which precedes the switches. Large resistors that provide for the bias current in the PA should be used in the bias circuit such that the temperature dependency of the bias current does not produce thermal runaway. However, large resistors or at least large chokes are bulky and difficult to integrate. Additionally, switching on or off the transistors at the output, for amplitude modulation will change the output impedance and therefore the output matching conditions between the PA and the antenna. This can result in loss of power efficiency.

It is therefore an object of the present invention to provide a polar modulation apparatus and method, which enable tracking of fast amplitude modulated signals at reduced costs.

The invention is defined by the independent claims. Dependent claims The dependent claims define advantageous embodiments.

Accordingly, a new concept of a polar modulation is provided which uses a static DC-DC converter and a power, efficiency, or linearity controlled output power amplifier.

Additionally, the proposed bias control via the bias input enables enhanced power control and class—operation control. The proposed solution thus can be tailored to different input power levels and efficiency requirements. As the DC-DC converter at the output of the power amplifier can be used as a static converter, there is no need for agile AM tracking any longer. The DC-DC converter can however still solve some envelope tracking function if necessary for OFDM applications. However, no large bandwidth is required. Fast varying AM modulated signals can be tracked, bearing in mind that the bandwidth of the common-mode loop is in the range of e.g. 1 GHz.

Moreover, the above solution leads to an improved linearity of the differential power amplifier means, since no extra switching components are required at the output of the power amplifier circuitry due to the fact that the DC-DC converter is a static converter. The input of the amplitude modulation component can have a constant biasing part which helps in controlling the class of operation of the differential power amplifier circuitry tailored for different input powers and efficiency requirements. Furthermore, the input power of the phase modulation component can be held constant and the output power of the differential power amplifier circuitry can be controlled by the amplifying means. This provides an improved control range of the output power (e.g. −50 dBm . . . +30 dBm).

The amplifying circuitry may comprise at least one current amplifier stage with unity voltage gain. Therefore, the power gain of the amplifier stages is equal to the current gain and can be digitally controlled. Controlling the gain of the stages thus operates directly on the power gain and thereafter the output power of the differential power amplifier means.

According to a first aspect, the bias control circuitry may comprise push-pull circuit means connected as a driver circuit to the differential power amplifier means. The phase modulation component can be amplified by the amplifying stages and applied to the push-pull output driver. In the push-pull driver, the amplitude modulation component can be applied as a common-mode signal that modulates the common-mode current of the differential power amplifier means. As a specific example, the amplitude modulation signal may be applied to the push-pull circuit means as a common mode signal adapted to modulate the common-mode current of the differential power amplifier circuitry based on a current mirroring effect.

According to a second aspect, the bias control circuitry may comprise mixer circuit means for adding the amplitude modulation component to the common-mode current of the differential power amplifier means. According to an example, the mixer circuit means may comprise a Gilbert cell. This second aspect provides the advantage that the differential power amplifier circuitry can be implemented as a stand-alone discrete component, while the mixer circuit means can provide the required extra amplitude modulation input for the discrete differential power amplifier means.

According to a third aspect, the bias control circuitry can be adapted to supply the amplitude modulation component to a cascode circuit of the differential power amplifier means. This measure is advantageous for CMOS (Complementary Metal Oxide Semiconductor) applications.

In all above aspects, the bias control circuitry can be adapted to be based on a digital control. Thereby, digitally controlled parameters (e.g. power, efficiency, modulation and linearity) can provide an accurate monitoring of the differential power amplifier means.

Additionally, power control means may be provided for controlling power of the polar modulation apparatus by changing at least one tail current of the amplifying means.

The in-phase component and a quadrature-phase component of the input signal may be generated by baseband digital processing means, and converted by conversion means to generate the phase modulation component. This may be achieved by providing at least one of an IQ mixer circuit, a zero intermediate frequency transmitter circuit and a fractional N synthesizer phase locked loop circuit.

The present invention will now be described based on embodiments with reference to the accompanying drawings, in which.

The embodiments will now be described in connection with a polar modulator arrangement, which uses an IQ modulation in a wireless communication system, such as Bluetooth, UWB (Ultra-Wideband), WLAN (Wireless Local Area Network) or GSM EDGE (Global System for Mobile communication Enhanced Data rates for GSM Evolution).

Figure 1:
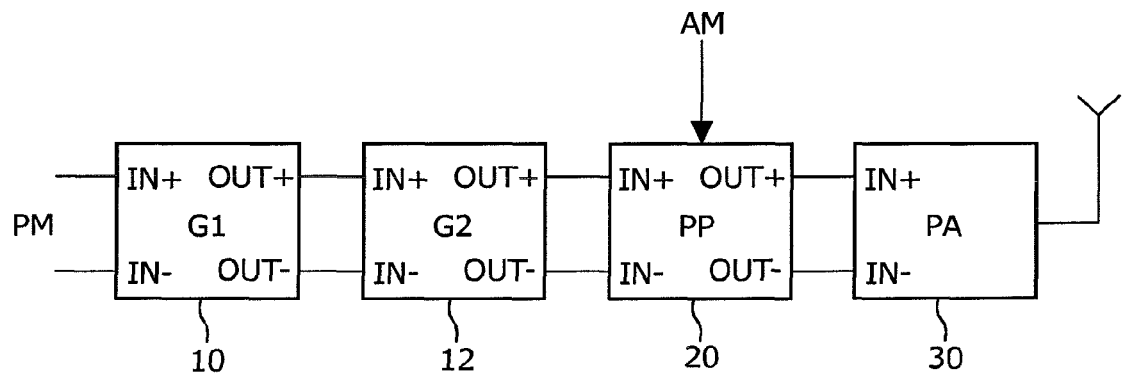
FIG. 1 shows a schematic block diagram of the concept of a polar modulator circuit according to a first preferred embodiment.

FIG. 1 shows a schematic block diagram of a differential polar modulator concept according to the first preferred embodiment with separated paths for an amplitude-modulated or amplitude modulation component AM and a phase-modulated or phase modulation component PM. The phase modulation component PM is amplified by first and second amplifying or gain stages 10, 12 and applied to a push-pull output driver 20. In the push-pull output driver 20, the amplitude modulation component AM is applied as a common-mode signal that modulates the common-mode current of a differential PA 30. The two gain stages 10, 12 can be current amplifiers with unity voltage gain. Therefore, the power gain of the gain stages 10, 12 is equal to the current gain and can be digitally controlled. Controlling the gain of the two gain stages 10, 12 operates directly on the power gain and thereafter the output power of the PA 30. This concept provides the advantage that the DC-DC converter (not shown in FIG. 1) at the output of the PA 30 can be implemented as a static converter. There is no need for agile AM tracking any longer. Moreover, the linearity of the PA 30 will improve, since no extra switching components are required at the output of the PA 30 in view of the static implementation of the DC-DC converter.

Figure 3:
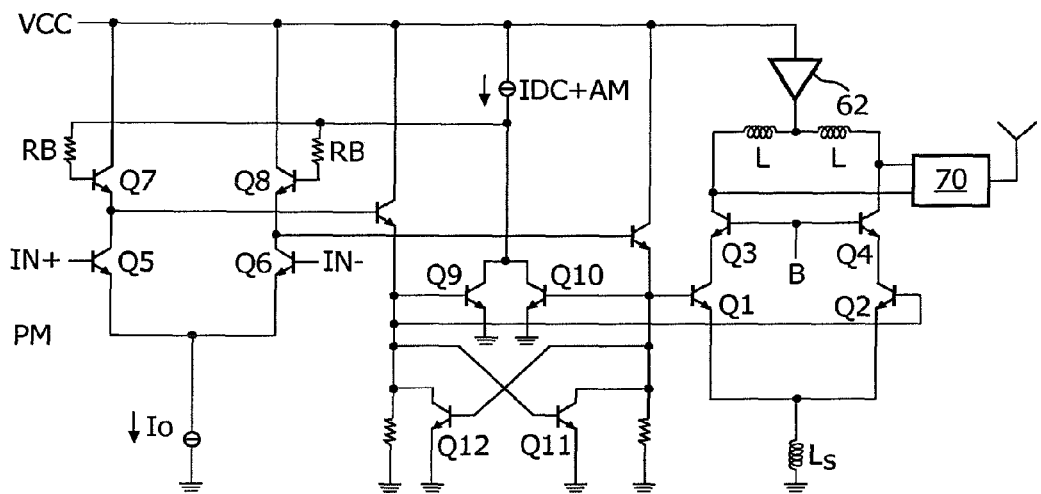
FIG. 3 shows a schematic circuit diagram of a polar modulation circuit according to the first preferred embodiment with a push-pull circuit.

FIG. 3 shows a first example of a transistor level implementation of the schematic block diagram of FIG. 1. The PA 30 is a implemented as a differential cascode amplifier with transistors Q1 to Q4 and inductors L as load. Only one gain stage is shown here, as the gain stages are identical. The gain stage comprising transistors Q5 to Q8 in the left part of FIG. 3 is a differential translinear cell with active loads implemented by the transistors Q7 and Q8. A characteristic of these cells is the independence between the rise/fall time and the amplitude of the amplified signal. By keeping voltage swings small (e.g. <100 mV peak-to-peak difference) these cells can work at low voltages with their gain controlled by the value of resistors RB and the tail current. Another problem solved by the gain stage is the ground reference of the output stage in the right part of FIG. 3. Common-drain connected transistors Q9 and Q10 of the intermediate push-pull circuit are measuring the common-mode at the output of the emitter-follower transistors connecting the emitter terminals of the transistors Q7 and Q8 of the gain stage to the base terminals of transistors Q9 and Q10 of the push-pull circuit and generate a clean reference for biasing the base terminal of the active loads Q7 and Q8. Therefore, there is no pollution of the positive supply voltage VCC. The common-mode current of transistors Q9 and Q10 is a replica of the bias current in the PA of the output stage. The bias current in the PA can be varied by adding the amplitude modulation component AM in order to change a bias current IDC applied to the common-drain connected transistors Q9 and Q10. Transistors Q12 and Q11 of the push-pull circuit are driving the output transistors Q1 and Q2 of the PA in a push-pull configuration in order to charge/discharge their large (parasitic) capacitance $C_{BC}$ (not shown). A simple method to modulate the amplitude of the output signal of the PA is to provide the output of a current DAC in parallel with the DC biasing current IDC. The DC current IDC controls the class of operation of the PA independent from the added amplitude modulation component AM. By increasing the tail current of the gain stage, the amplitude of the current signals in the transistors Q7 and Q8 will increase, producing a differential signal replica in the output transistors Q1 and Q2. This is facilitated by the mirroring effect of the signal currents in the output transistors Q1 and Q2 with a gain factor depending on the emitter area ratios of transistors Q1/Q7 and Q2/Q8, respectively. The power control is provided by controlling the tail current Io of the gain stage. In a class AB output PA, the bias current of the output stage and the input power are exponentially related. Therefore, the DC current IDC should exponentially track the input power variation controlled by the bias current Io. For ease of control and exponential law conformity, the power and the bias control can be digital controls. In this case, a static DC-DC converter 62 can be used for providing the supply voltage to the PA in an efficient manner. By monitoring the input power the DC-DC converter 62 will provide a larger or a smaller supply voltage accordingly.

Figure 4:
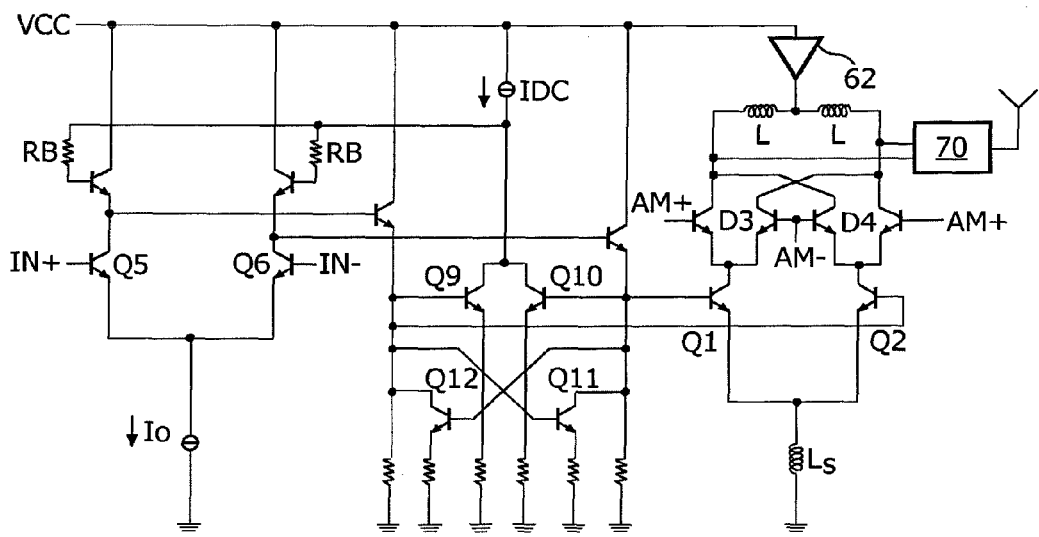
FIG. 4 shows a schematic circuit diagram of a polar modulation circuit according to a second preferred embodiment with a mixer circuit.

FIG. 4 shows a circuit diagram of a transistor level implementation according to the second preferred embodiment. By keeping a small biasing current in the output stage as in the case of class A and AB the cascode transistors Q3 and Q4 if FIG. 3 can be replaced by a mixer circuit, such as a Gilbert cell shown in FIG. 4, where the amplitude modulation component AM is added at the base terminals of respective differential transistor pairs D3 and D4. When the output stage is conceived as a stand-alone discrete component, the cascaded stage with the mixer circuit can provide the required extra amplitude modulation input for the discrete PA. In this case, a power monitor and an on-chip BALUN may be added. Thus, the proposed differential cascoded PA will give an extra isolation for load matching and gives an extra degree of freedom at the output. By cascading, the capacitive loading of the driver circuit is reduced. The gain stage provides a power gain, which depends on current ratios but is independent of temperature and process. The low voltage swing properties are also transferred to the input of the PA. Each stage has a large bandwidth and the rise/fall time of each gain stage is independent of the temperature. Furthermore, the push-pull stage is needed in order to achieve fast charge/discharge of the base terminal(s) of the output stage, and the output stage is driven from a low impedance node increasing the breakdown voltage close to $BV_{CBO}$. Moreover, the ABCD control or common-mode control of the push-pull stage has a large bandwidth. This can be used for the amplitude modulation of the output stage. This way of injecting the amplitude modulation component AM has high linearity and offsets the need for an agile DC-DC converter. The ABCD input is used also for controlling accurately the bias current of the PA independent of the temperature. Different classes of operation are possible A, AB, B, C and D (depending of the load). The current gain of the total circuit depends on emitter area ratios and is therefore independent of temperature and process spread when the temperature on the die is the same. Furthermore, the stray inductance $L_s$ given by the bonding wires is a part of the design and does not have any influence on the differential mode gain and decreases the common-mode gain, which is required for stability reasons. The achieved principle of on-chip broadband and off-chip small-band pays off in the case of a multimode/multi-standard approach. The selectivity required at the antenna can be taken care of by a tunable bandpass filter realized with PIN or hyper-abrupt varactors.

Figure 2:
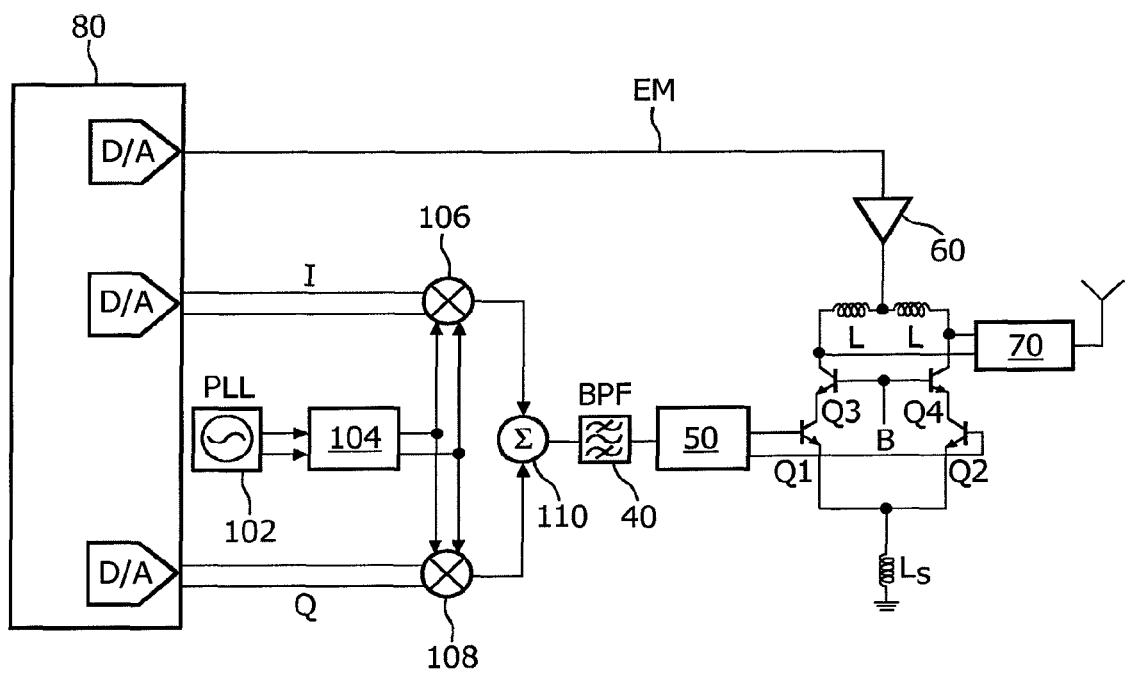
FIG. 2 shows a block diagram of a conventional polar modulator circuit.
Figure 5:
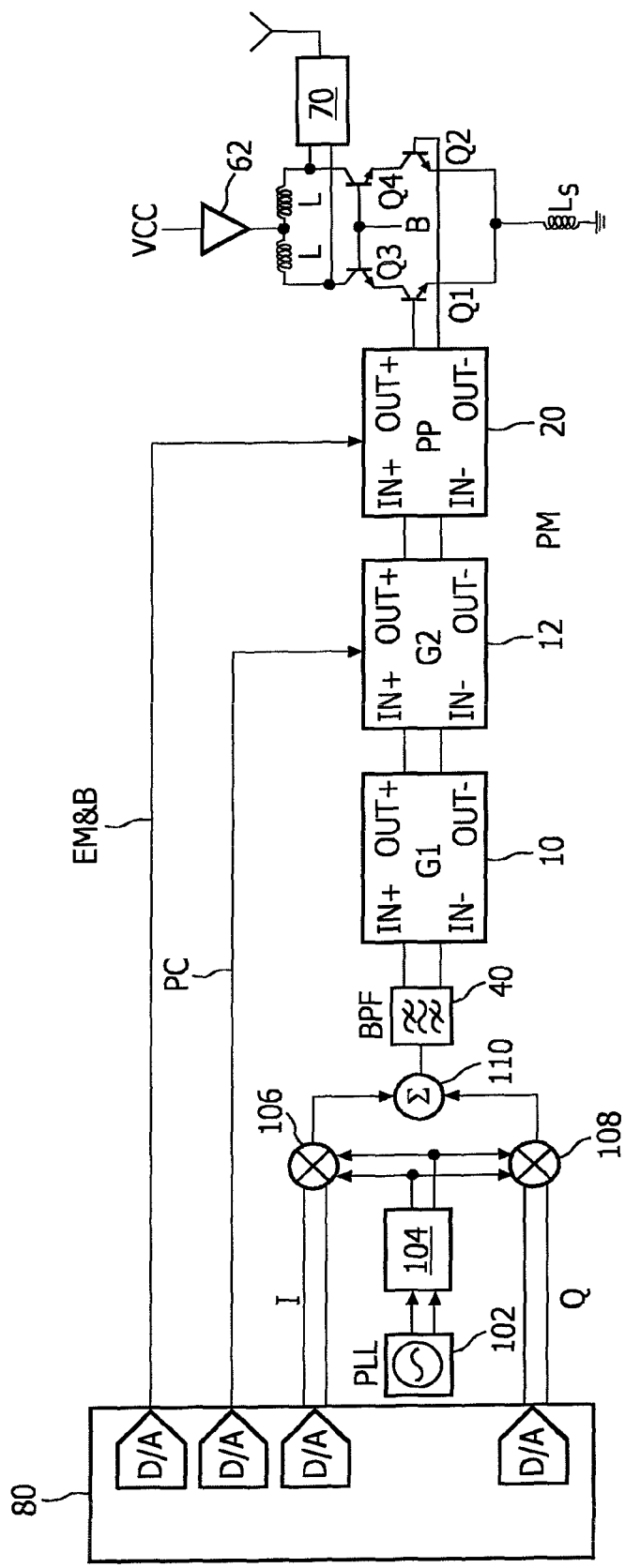
FIG. 5 shows an enhanced block diagram of a polar modulation circuit according to a first implementation example based on the first preferred embodiment.

FIG. 5 shows an enhanced block diagram of the complete concept of a polar modulation circuit according to a first implementation example based on the above first preferred embodiment. It is noted that many of those blocks, which have already been described, in connection with the conventional polar modulator of FIG. 2 are not described again here, for reasons of brevity. A baseband digital processor 80 provides the two-phase I/Q signals that are up-converted with an IQ mixer 106, 108 to the RF frequency. The phase modulation component PM and the amplitude or envelope modulation component EM are applied to the gain stages 10, 12 and the output stage. The input power of the phase-modulated component is constant. The envelope-modulated component EM is generated from a D/A converter of the baseband digital processor 80 and applied to the common-mode circuit of the push-pull stage 20. An extra bias current is thereby generated. This current depends on the input power and linearly related to it on a logarithmic scale. The power control PC changes the gain of the second gain stage 12 and the power at the input of the PA. Hence, the output power of the PA is modified, too.

Figure 6:
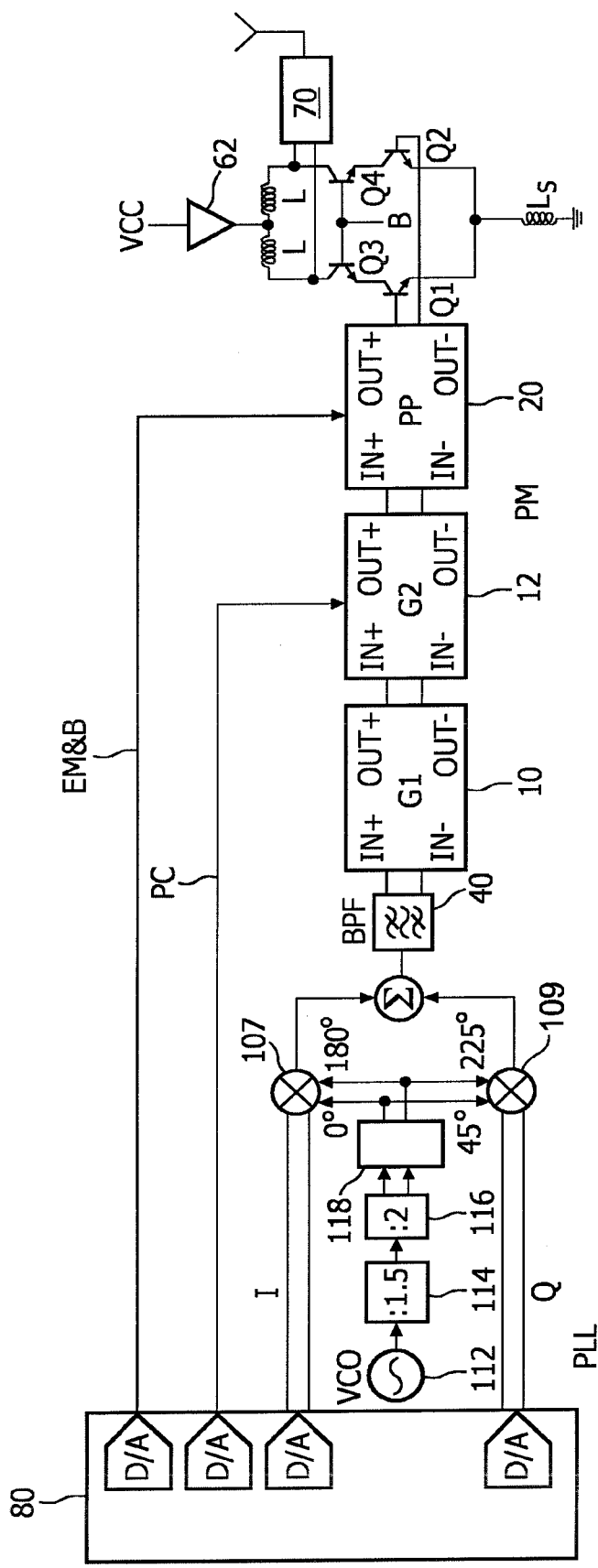
FIG. 6 shows an enhanced block diagram of a polar modulation circuit according to a second implementation example based on the first preferred embodiment.

FIG. 6 depicts an enhanced block diagram of the complete concept of a polar modulation circuit according to a second implementation example based on the above first preferred embodiment with a zero IF transmitter (ZIF). A VCO 112 as a part of the PLL has a 1.5 divider 114 as a load (not a part of the PLL) with 50% duty cycle. A divider 116 by 2 follows it and generates a quadrature signal at the frequency $f_{VCO}/3$. A polyphase filter 118 produces phases 0°, 45', 90°, 135°, 180° and 225° controlling the clock inputs of the two sub-harmonic mixers (SH) 107, 109. As such, the VCO 112 and the output stage with the PA are not working at the same frequency and they are not harmonically related. As a consequence, less VCO pulling from the PA can be achieved.

Figure 7:
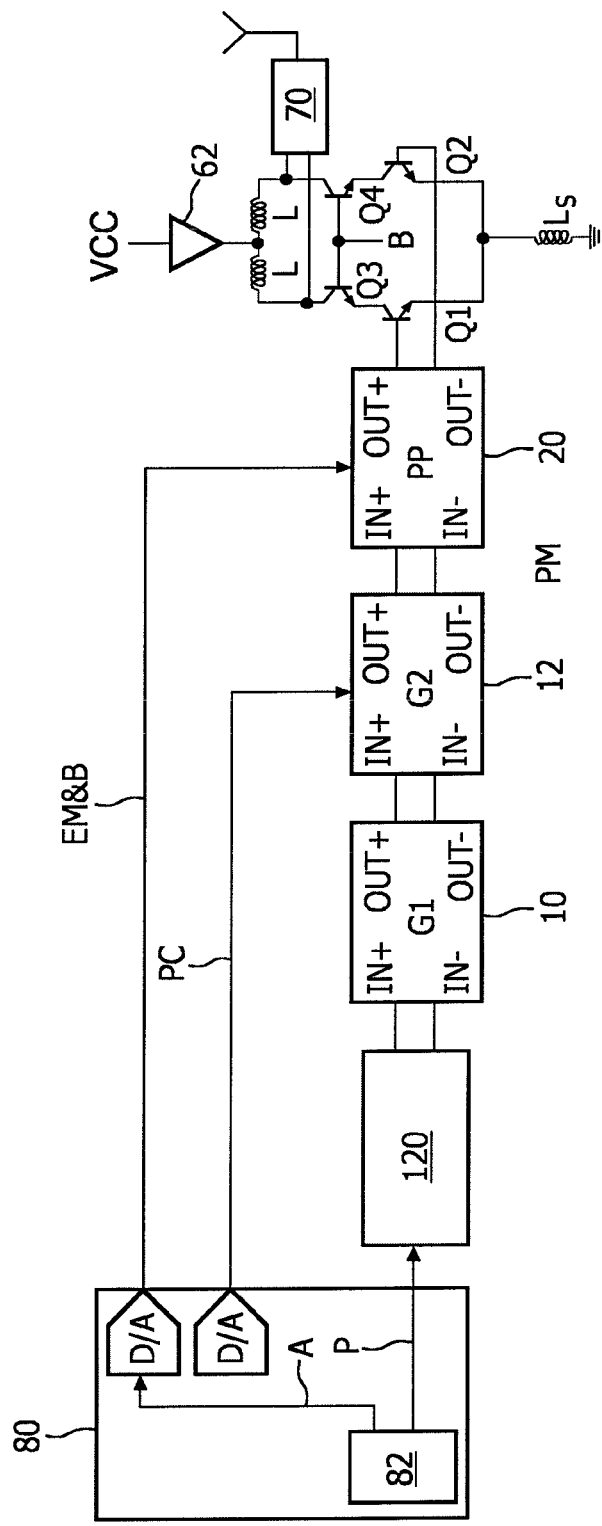
FIG. 7 shows an enhanced block diagram of a polar modulation circuit according to a third implementation example based on the first preferred embodiment.

FIG. 7 shows an enhanced block diagram of a polar modulation circuit according to a third implementation example based on the first preferred embodiment, where the polar modulation concept is further integrated by using a fractional-N synthesizer PLL 120 for the phase modulation. Thereby, the bandpass filter 40 and the IQ up-conversion mixers can be dispensed with. However, in this example, large-bandwidth phase modulation signal PM should be tracked by the PLL 120.

Figure 8A:
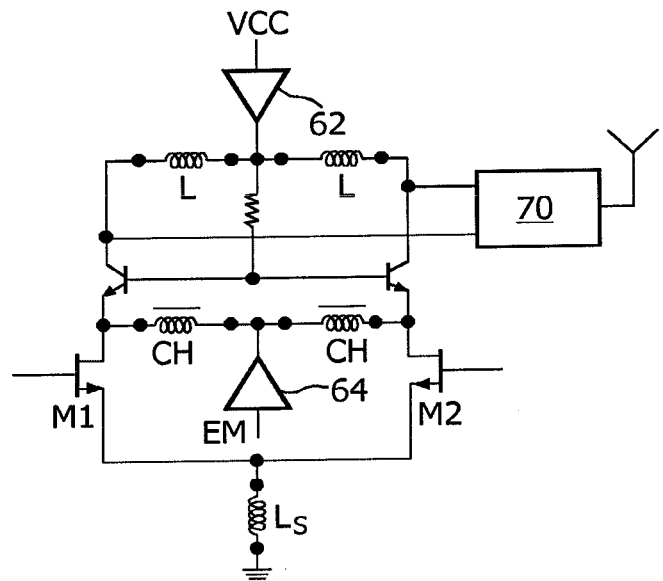
FIGS. 8A and 8B show circuits diagram of two examples of differential power amplifier circuits according to a third preferred embodiment.
Figure 8B:
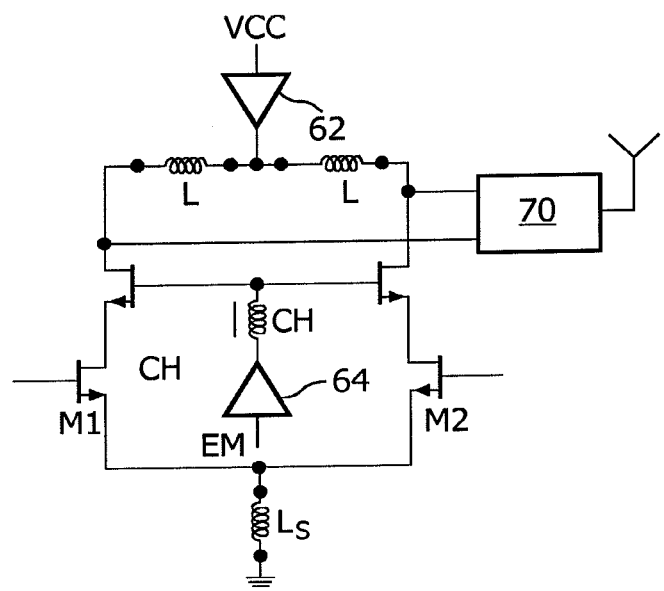

FIGS. 8A and 8B show circuits diagram of two examples of differential PA circuits according to the third preferred embodiment. The third preferred embodiment is based on a CMOS implementation of the proposed polar modulation concept and in which the same topology is used. In the first example of FIG. 8A, the amplitude or envelope modulation component EM is applied via an amplifier circuit 64 and choke coils CH to the drain terminals of understage transistors M1 and M2 of the cascade circuit of the PA. These transistors M1 and M2 are operated in the linear region. The upper cascode transistors may be bipolar transistors in a BiCMOS implementation and CMOS transistors in a CMOS process. In the second example of FIG. 8B, the amplitude or envelope modulation component EM is applied via the amplifier circuit 64 and choke coils CH to the gate terminals of the upper cascode transistors. This circuit works as a differential MOS tetrode for the differential input signals at the understage transistors M1 and M2 with gain control from the gate terminals of the upper cascode transistors. In all three embodiments of FIGS. 3 to 7, 8A and 8B, the matching circuit 70 can be arranged as a circuit external to the PA for having more flexibility for different frequency bands and applications.

In summary, a polar modulation apparatus and method have been described, in which a polar-modulated signal is generated based on separately processed phase modulation (PM, EM) and amplitude modulation (AM) components of an input signal. An amplified polar modulated output signal is generated in accordance with the phase modulation and amplitude modulation components by using a differential power amplifier circuitry and supplying an amplified phase modulation component to a differential input of the differential power amplifier means. A bias input of the differential power amplifier circuitry is controlled based on the amplitude modulation component, so as to modulate a common-mode current of the differential power amplifier means. Thereby, a new concept of a polar modulator with static DC-DC converter and power and/or efficiency and/or linearity controlled output power amplifier can be achieved. In the conventional polar modulator approach a fast DC-DC converter is used for tracking the envelope of the signal. This conventional approach is hampered by the tracking bandwidth of the DC-DC converter and the price of this device. The proposed solution according to the above embodiments circumvents the disadvantages encountered in the DC-DC converter approach. Additionally, the proposed power and operation class control provides a solution tailored to different input power levels and efficiency requirements. Digitally controlled parameters (power, efficiency, modulation and/or linearity) can be used to provide an accurate monitoring of the PA.

It is noted that the present invention is not restricted to the above preferred embodiments, but can be applied to any polar modulation and power amplifier architecture which is based on a processing of separated amplitude and phase modulation signals. Hence, the preferred embodiments may vary within the scope of the attached claims.

The term "comprises" or "comprising" when used in the specification including the claims is intended to specify the presence of stated features, means, steps or components, but does not exclude the presence or addition of one or more other features, means, steps, components or group thereof. Further, the word "a" or "an" preceding an element in a claim does not exclude the presence of a plurality of such elements. Moreover, any reference sign does not limit the scope of the claims.

The invention claimed is:

1. A wireless communication apparatus comprising:
    an IQ modulation circuit configured and arranged to generate IQ modulation components, including an in-phase (I) component and a quadrature-phase component (Q), of an input signal, and convert the in-phase component and the quadrature-phase component to a phase modulation component;
    differential power amplifier circuitry configured and arranged to generate an amplified polar modulated output signal in accordance with the phase modulation component and an amplitude modulation component of the input signal for processing in separate paths;
    amplifying circuitry configured and arranged to amplify the phase modulation component and, in response, to provide an amplified phase modulation component to a differential input of the differential power amplifier circuitry;
    bias control circuitry configured and arranged to control a bias input of the differential power amplifier circuitry based on the amplitude modulation component, and therefrom providing a signal for modulating a common-mode current of the differential power amplifier circuit.

2. The apparatus of claim 1, wherein the IQ modulation circuit is further configured and arranged to modulate a communication.

3. The apparatus of claim 1, wherein the IQ modulation circuit is further configured and arranged to modulate an Ultra-Wideband (UWB) communication.

4. The apparatus of claim 1, wherein the IQ modulation circuit is further configured and arranged to modulate a WLAN (Wireless Local Area Network) communication.

5. The apparatus of claim 1, wherein the IQ modulation circuit is further configured and arranged to modulate a GSM Edge (Global System for Mobile communication Enhanced Data Rates) communication.

6. The apparatus of claim 1, wherein the output signal of the differential power amplifier circuitry is between −50 dBm and +30 dBm.

7. The apparatus of claim 1, wherein the amplifying circuitry includes at least one current amplifier stage having unity voltage gain that can be digitally controlled.

8. The apparatus of claim 1, wherein the bias control circuitry includes push-pull circuitry configured and arranged as a driver circuit of the differential power amplifier circuitry.

9. The apparatus of claim 1, further comprising a step of modulating an Ultra-Wideband (UWB) communication utilizing the IQ modulation components an.

10. The apparatus of claim 1, further comprising a step of modulating a WLAN (Wireless Local Area Network) communication utilizing the IQ modulation components.

11. The apparatus of claim 1, further comprising a step of modulating a GSM Edge (Global System for Mobile communication Enhanced Data Rates) communication utilizing the IQ modulation components.

12. A method of wireless communication via signal modulation, comprising:
    generating IQ modulation components, including an in-phase (I) component and a quadrature-phase component (Q), of an input signal, and convert the in-phase component and the quadrature-phase component to a phase modulation component;

generating an amplified polar modulated output signal, utilizing differential power amplifier circuitry, in accordance with the phase modulation component and an amplitude modulation component of an input signal for processing in separate paths;

amplifying the phase modulation component and to provide an amplified phase modulation component to a differential input of the differential power amplifier circuitry;

controlling a bias input of the differential power amplifier circuitry based on the amplitude modulation component, and therefrom providing an input modulating a common-mode current of the differential power amplifier circuit.

13. The method of claim 12, further comprising a step of applying the amplified polar modulated output signal to a transmission antenna using impedance-matching circuitry.

14. The method of claim 12, further comprising a step of modulating a communication utilizing the IQ modulation components.

15. A wireless communication apparatus for use in signal modulation, the apparatus comprising:

an IQ modulation circuit configured and arranged to generate IQ modulation components, including an in-phase (I) component and a quadrature-phase component (Q), of an input signal, and convert the in-phase component and the quadrature-phase component to a phase modulation component;

differential power amplifier circuitry configured and arranged to generate an amplified polar modulated output signal in accordance with the phase modulation component and an amplitude modulation component of the input signal for processing in separate paths;

amplifying circuitry configured and arranged to amplify the phase modulation component and, in response, to provide an amplified phase modulation component to a differential input of the differential power amplifier circuitry;

bias control circuitry configured and arranged to control a bias input of the differential power amplifier circuitry based on the amplitude modulation component, and therefrom providing a signal for modulating a common-mode current of the differential power amplifier circuit; and impedance-matching circuitry configured and arranged to apply the amplified polar modulated output signal to a transmission antenna, wherein the IQ modulation is in accordance with a wireless communication industry-standard.

16. The apparatus of claim 15, wherein the wireless communication industry-standard is Ultra-Wideband (UWB).

17. The apparatus of claim 15, wherein the wireless communication industry-standard is WLAN (Wireless Local Area Network).

18. The apparatus of claim 15, wherein the wireless communication industry-standard is GSM Edge (Global System for Mobile communication Enhanced Data Rates).

19. The apparatus of claim 15, wherein the impedance-matching circuitry can be configured and arranged external to the differential power amplifier circuitry, the amplifying circuitry, and the bias control circuitry.

* * * * *